United States Patent
Jung et al.

(10) Patent No.: US 11,908,710 B2
(45) Date of Patent: Feb. 20, 2024

(54) APPARATUS AND METHOD FOR PROCESSING SUBSTRATE

(71) Applicant: SEMES CO., LTD., Cheonan-si (KR)

(72) Inventors: Jin Woo Jung, Cheonan-si (KR); Do Hyeon Yoon, Cheonan-si (KR); Yong Hee Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/520,826

(22) Filed: Nov. 8, 2021

(65) Prior Publication Data

US 2022/0208565 A1 Jun. 30, 2022

(30) Foreign Application Priority Data

Dec. 29, 2020 (KR) .................. 10-2020-0185936

(51) Int. Cl.
*H01L 21/67* (2006.01)
*H01L 21/02* (2006.01)
*H01L 21/677* (2006.01)

(52) U.S. Cl.
CPC .. *H01L 21/67028* (2013.01); *H01L 21/02101* (2013.01); *H01L 21/67103* (2013.01); *H01L 21/67248* (2013.01); *H01L 21/67739* (2013.01)

(58) Field of Classification Search
CPC ........ H01L 21/67028; H01L 21/02101; H01L 21/67103; H01L 21/67248; H01L 21/67739; H01L 21/67051; H01L 21/6719; H01L 21/67742; H01L 21/67745; H01L 21/68742; H01L 21/67034; H01L 21/67098; H01L 21/02057; H01L 21/67259; H01L 21/68707; B25J 11/0095; B25J 15/0052; B25J 19/02; F26B 5/005; G01J 5/0003
See application file for complete search history.

(56) References Cited

U.S. PATENT DOCUMENTS

| | | | | |
|---|---|---|---|---|
| 6,074,443 A | * | 6/2000 | Venkatesh | ......... H01L 21/67276 29/25.01 |
| 6,398,875 B1 | * | 6/2002 | Cotte | ................ H01L 21/67034 34/448 |
| 6,843,855 B2 | * | 1/2005 | Verhaverbeke | ... H01L 21/67167 134/1 |

(Continued)

FOREIGN PATENT DOCUMENTS

| KR | 1020110080632 | 7/2011 |
|---|---|---|
| KR | 10-2017-0134091 | 12/2017 |

OTHER PUBLICATIONS

Office Action from Korean Intellectual Property Office dated Jun. 4, 2023.

*Primary Examiner* — Duy Vu N Deo
*Assistant Examiner* — Christopher Remavege

(57) ABSTRACT

A substrate processing apparatus includes a substrate cleaning unit cleaning a substrate, a substrate drying unit drying the substrate, and a transfer robot transferring the substrate between the substrate cleaning unit and the substrate drying unit. The substrate drying unit includes a substrate processing container having a substrate processing space accommodating the substrate, and the transfer robot includes a surface temperature measurement sensor measuring a surface temperature of the substrate processing container.

12 Claims, 10 Drawing Sheets

(56) References Cited

U.S. PATENT DOCUMENTS

| | | | | |
|---|---|---|---|---|
| 7,000,621 | B1* | 2/2006 | Verhaverbeke | H01L 21/67173 |
| | | | | 134/68 |
| 8,224,607 | B2* | 7/2012 | Sakhare | G01B 11/03 |
| | | | | 702/95 |
| 8,790,470 | B2* | 7/2014 | Lee | H01L 21/31111 |
| | | | | 438/689 |
| 10,818,526 | B2* | 10/2020 | Ha | H01L 21/67248 |
| 11,024,517 | B2 | 6/2021 | Lee et al. | |
| 11,101,163 | B2* | 8/2021 | Liu | H01L 21/67173 |
| 2004/0226510 | A1* | 11/2004 | Hanson | H01L 21/67196 |
| | | | | 118/719 |
| 2012/0240426 | A1* | 9/2012 | Hayashi | H01L 21/02068 |
| | | | | 34/351 |
| 2012/0304485 | A1* | 12/2012 | Hayashi | H01L 21/02057 |
| | | | | 257/E21.328 |
| 2016/0372355 | A1* | 12/2016 | Zhang | G05D 23/1931 |
| 2017/0256397 | A1* | 9/2017 | Goshi | H01L 21/02101 |
| 2019/0035656 | A1* | 1/2019 | Ha | H01L 21/67248 |
| 2019/0237354 | A1* | 8/2019 | Liu | H01L 21/68707 |

* cited by examiner

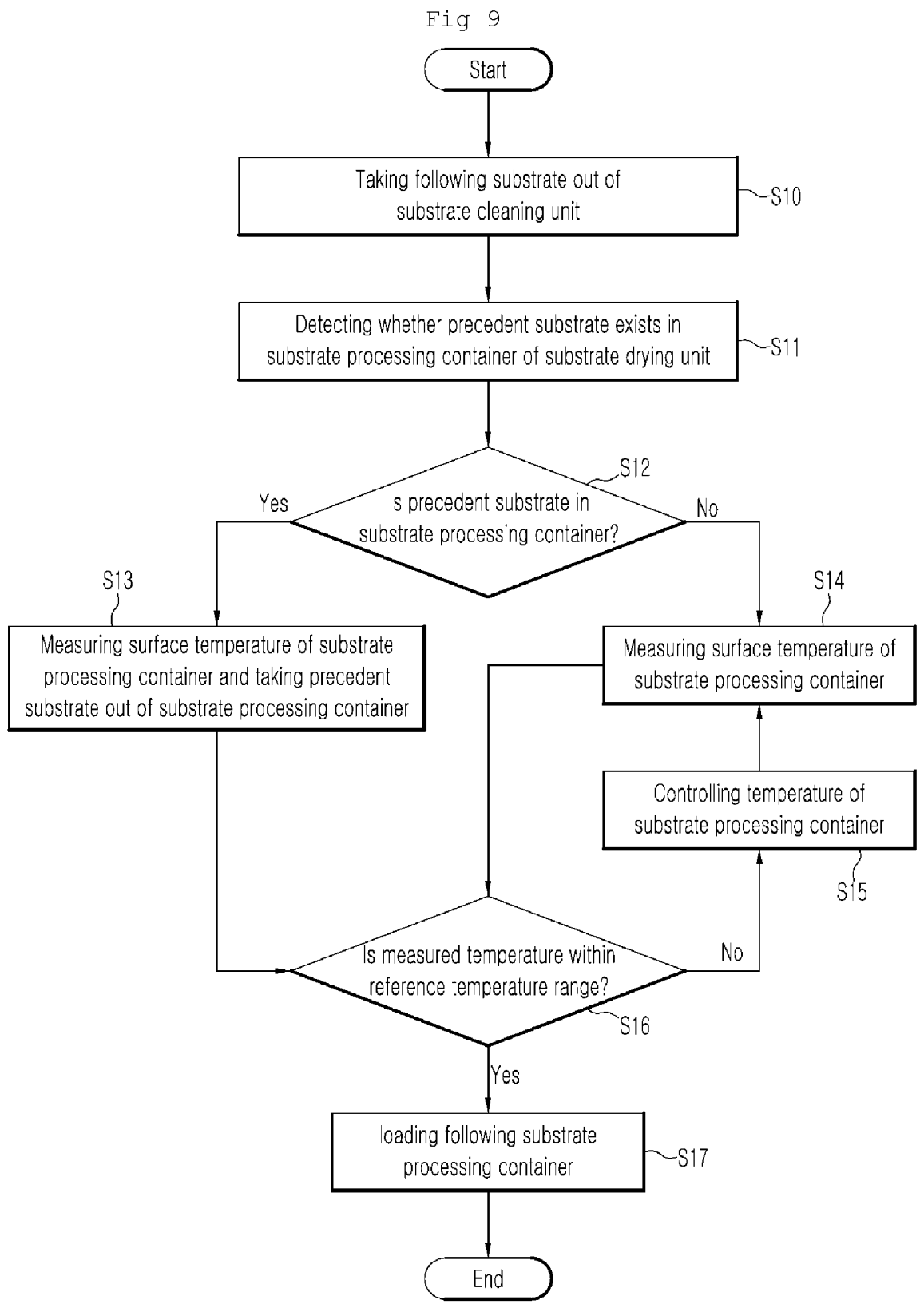

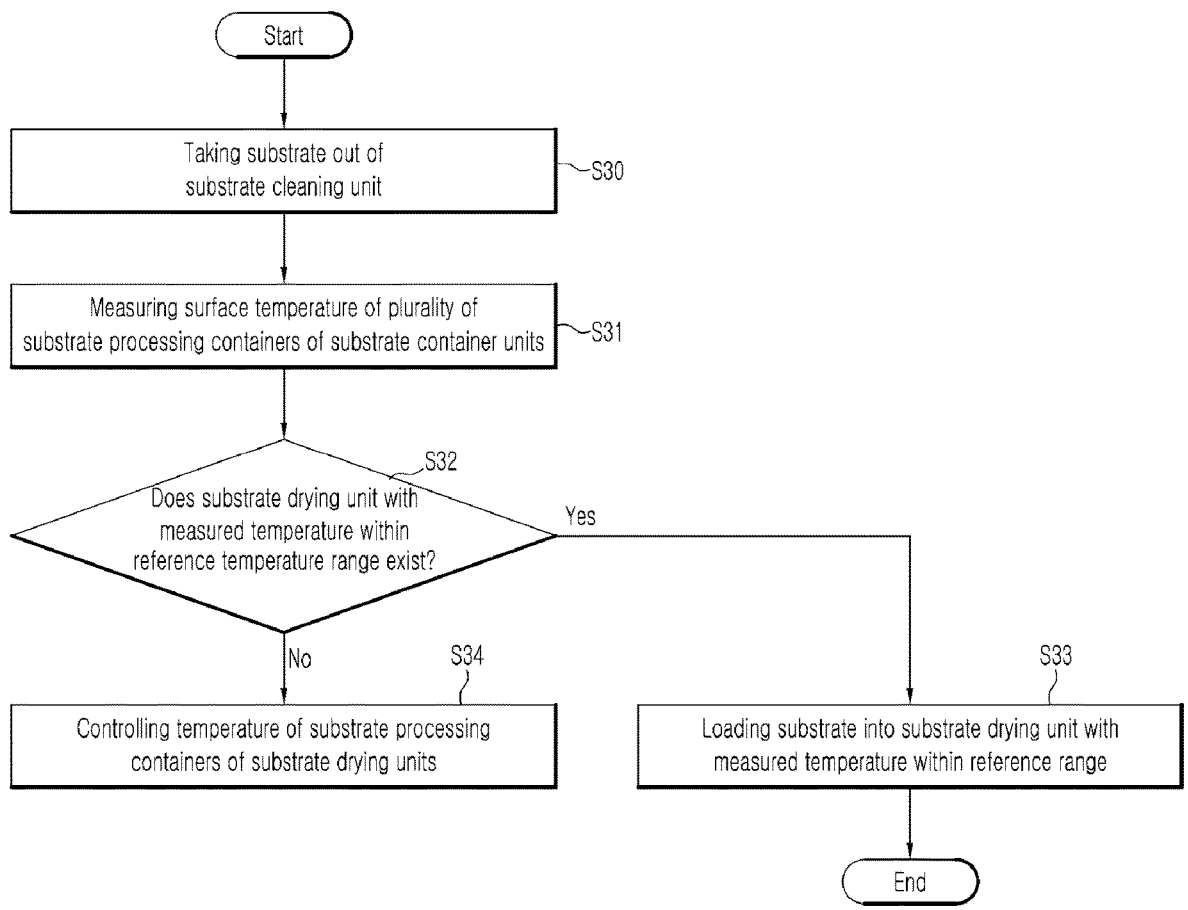

APPARATUS AND METHOD FOR PROCESSING SUBSTRATE

CROSS REFERENCE TO RELATED APPLICATION

The present application claims priority to Korean Patent Application No. 10-2020-0185936, filed Dec. 29, 2020, the entire contents of which is incorporated herein for all purposes by this reference.

BACKGROUND OF THE INVENTION

Field of the Invention

The present disclosure relates to a substrate processing apparatus and a substrate processing method.

Description of the Related Art

In general, a semiconductor device is manufactured through various processes including a photolithography process for forming a circuit pattern on a substrate such as a silicon wafer.

During the semiconductor device manufacturing process, various foreign substances such as particles, organic contaminants, and metal impurities are generated. Such foreign substances cause a defect in the substrate and directly affect the yield of the semiconductor device. Therefore, a cleaning process for the substrate is essentially required to remove the foreign substances during the semiconductor device manufacturing process.

In order to clean the substrate, the cleaning process of cleaning the substrate with a cleaning agent and a drying process of drying the substrate are performed.

As the drying process, a supercritical drying process of drying the substrate by using supercritical fluid is performed.

The supercritical fluid has both gas and liquid properties at a temperature equal to or higher than the critical temperature and a pressure equal to or higher than the critical pressure, has excellent diffusivity and water permeability, has high solubility, and has a low surface tension, thereby being efficiently used in the substrate drying process.

In order to perform the supercritical drying process, high-temperature supercritical environment may be necessarily created in a substrate processing container in which the substrate is located.

As a related art, Patent Document 1 discloses a substrate cleaning device including the substrate processing container, a fluid supply, a thermoelectric plate, and a surface temperature measurement sensor. According to Patent Document 1, the surface temperature measurement sensor detects the temperature in a space in which the substrate is located.

As the substrate drying process is repeated, the surface temperature of the substrate processing container is increased. As a deviation occurs in the distribution of the surface temperature of the substrate processing container due to increasing of the surface temperature of the substrate processing container. The supercritical fluid is unevenly distributed due to the deviation in the distribution of the surface temperature of the substrate processing container. A defect may occur in the substrate due to the ununiform distribution of the supercritical fluid.

DOCUMENTS OF RELATED ART (Patent Document 1) Korean Patent Application Publication No. 10-2011-0080362 (2011 Jul. 13)

SUMMARY OF THE INVENTION

Accordingly, the present disclosure has been made keeping in mind the above problems occurring in the related art, and the present disclosure is intended to provide a substrate processing apparatus and a substrate processing method that are capable of measuring the surface temperature of a substrate processing container and of determining whether a substrate can be loaded into the substrate processing container on the basis of the surface temperature of the substrate processing container.

In order to achieve the above objective, according to one aspect of the present disclosure, there is provided a substrate processing apparatus including: a substrate cleaning unit configured to clean a substrate; a substrate drying unit configured to dry the substrate; and a transfer robot configured to transfer the substrate between the substrate cleaning unit and the substrate drying unit, wherein the substrate drying unit may include a substrate processing container having a substrate processing space accommodating the substrate, and the transfer robot may include a surface temperature measurement sensor configured to measure a surface temperature of the substrate processing container.

The substrate processing apparatus may include a controller that may determine whether the substrate is loaded into the substrate processing container on the basis of the surface temperature of the substrate processing container measured by the surface temperature measurement sensor.

The transfer robot may include: a first hand configured to take the substrate out of the substrate drying unit; a second hand configured to load the substrate into the substrate cleaning unit; and a third hand configured to take the substrate out of the substrate cleaning unit and then load the substrate into the substrate drying unit, and the surface temperature measurement sensor may be provided in the first hand.

The first hand may include: a substrate load member on which the substrate may be loaded; and a guide member projected from the substrate seating member and configured to support a lateral surface of the substrate, and the surface temperature measurement sensor may be mounted in an accommodation groove of the guide member.

The substrate processing container may include a first body and a second body that may be coupled with each other to provide the substrate processing space, wherein the first body may have a first surface facing the second body, the second body may have a second surface facing the first surface of the first body, and the surface temperature measurement sensor may be configured to measure a surface temperature of the first surface or a surface temperature of the second surface.

The surface temperature measurement sensor may include a plurality of surface temperature measurement sensors. The second body may be a plurality of heating modules that may be circumferentially arranged along a perimeter of a first circle that is around a center portion of the second surface. The plurality of surface temperature measurement sensors may be configured to measure the surface temperature of the second surface at a plurality of measuring locations. The plurality of measuring locations may be arranged along the perimeter of the first circler or a perimeter of a second circle concentric with the first circle.

The surface temperature measurement sensor may be a non-contact temperature sensor.

A substrate processing method configured to process a substrate by using a substrate processing apparatus that may include: a substrate cleaning unit configured to clean the substrate; and a substrate drying unit configured to dry the substrate and including a substrate processing container accommodating the substrate, the substrate processing method may include: measuring surface temperature of the substrate processing container; determining whether the surface temperature of the substrate processing container deviates from a preset reference temperature range; and when the surface temperature of the substrate processing container is within the preset reference temperature range, transferring the substrate from the substrate cleaning unit to the substrate drying unit.

The substrate processing method may include, when the substrate temperature of the substrate processing container is out of the preset reference temperature range, controlling the surface temperature of the substrate processing container.

The substrate processing method may include, before the measuring the surface temperature of the substrate processing container, detecting whether a precedent substrate exists in the substrate processing container, wherein, when the precedent substrate exists in the substrate processing container, the measuring the surface temperature of the substrate processing container may be performed after taking the precedent substrate out of the substrate processing container.

The substrate processing apparatus may include a plurality of substrate processing containers. The measuring the surface temperature and the determining the surface temperature may be performed for the plurality of substrate processing containers. The transferring the substrate may be performed by loading the substrate into a substrate processing container, among the plurality of substrate processing containers, having a surface temperature within the preset reference temperature range.

The substrate processing method may include controlling, in response to a surface temperature of a first substrate processing container, among the plurality of substrate processing containers, being out of the preset reference temperature range, the surface temperature of the first substrate processing container.

The substrate processing apparatus may include a transfer robot including a first hand, a second hand, and a third hand. The substrate processing method further includes taking the substrate out of the substrate drying unit by the first hand, loading the substrate into the substrate cleaning unit by the second hand, and taking the substrate out of the substrate cleaning unit and then loading the substrate into the substrate drying unit by the third hand. The measuring the surface temperature of the substrate processing container may be performed by a surface temperature measurement sensor provided in the first hand.

A substrate processing method configured to process a substrate by using a substrate processing apparatus that may include: a substrate cleaning unit configured to clean the substrate; and a substrate drying unit configured to dry the substrate and including a substrate processing container accommodating the substrate, the substrate processing method may include: taking the substrate out of the substrate cleaning unit; measuring surface temperature of the substrate processing container; determining whether the surface temperature of the substrate processing container deviates from a preset reference temperature range; when the surface temperature of the substrate processing container is within the preset reference temperature range, transferring the substrate to the substrate drying unit; and when the surface temperature of the substrate processing container is out of the preset reference temperature range, loading the substrate into the substrate cleaning unit.

The substrate processing method may include, when the substrate temperature of the substrate processing container is out of the preset reference temperature range, controlling the surface temperature of the substrate processing container.

The substrate processing method may include, before the measuring the surface temperature of the substrate processing container, detecting whether a precedent substrate exists in the substrate processing container, wherein, when the precedent substrate exists in the substrate processing container, the measuring the surface temperature of the substrate processing container may be performed after taking the precedent substrate out of the substrate processing container.

The substrate processing method may include supplying a chemical liquid to the substrate loaded into the substrate cleaning unit in the loading the substrate so as to prevent a surface of the substrate from drying.

The substrate processing apparatus may include a plurality of substrate processing containers. The measuring the surface temperature and the determining the surface temperature may be performed for the plurality of substrate processing containers. The transferring the substrate may be performed by loading the substrate into a substrate processing container, among the plurality of substrate processing containers, having a surface temperature within the preset reference temperature range.

The substrate processing method may include controlling, in response to a surface temperature of a first substrate processing container, among the plurality of substrate processing containers, being out of the preset reference temperature range, the surface temperature of the first substrate processing container.

The substrate processing apparatus may include a transfer robot including a first hand, a second hand, and a third hand. The substrate processing method may include taking the substrate out of the substrate drying unit by the first hand, loading the substrate into the substrate cleaning unit by the second hand, taking the substrate out of the substrate cleaning unit and then loading the substrate into the substrate drying unit by the third hand. The measuring the surface temperature of the substrate processing container may be performed by a surface temperature measurement sensor provided in the first hand.

In the substrate processing apparatus and the substrate processing method according to the embodiments of the present disclosure, the surface temperature measurement sensors configured to measure the surface temperature of the substrate processing container are provided in the transfer robot. Accordingly, the surface temperature measurement sensors may accurately measure the surface temperature of the substrate processing container. Accordingly, it is possible to prevent the substrate from being loaded in the substrate processing container while the surface temperature of the substrate processing container deviates from the preset temperature range. Therefore, while the surface temperature of the substrate processing container deviates from the preset temperature range, ununiform distribution of the supercritical fluid caused as the substrate is loaded into the substrate processing container may be prevented. Therefore, a defect of the substrate that may occur due to the ununiform distribution of the supercritical fluid may be prevented.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 9 is a flowchart schematically showing a substrate processing method according to an embodiment of the present disclosure.

FIG. 10 is a flowchart schematically showing a substrate processing method according to an embodiment of the present disclosure.

DETAILED DESCRIPTION OF THE INVENTION

Hereinbelow, a substrate processing apparatus and a substrate processing method according to embodiments of the present disclosure will be described with reference to accompanying drawings.

Referring to FIGS. 1 to 7, the substrate processing apparatus according to an embodiment of the present disclosure will be described.

Figure 1:
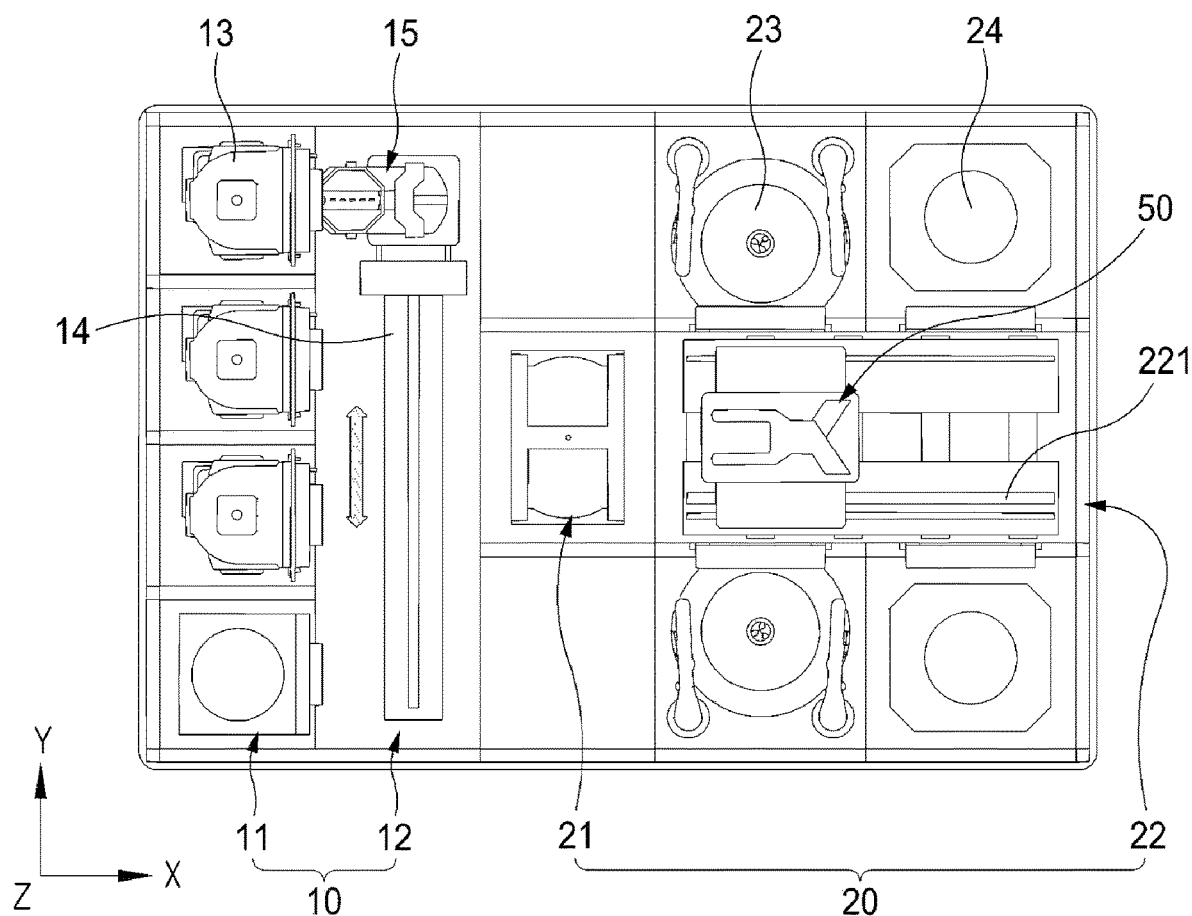
FIG. 1 is a view schematically showing a substrate processing apparatus according to an embodiment of the present disclosure.

As shown in FIG. 1, the substrate processing apparatus includes an index part 10 and a processing part 20.

The index part 10 includes a load port 11 and a transfer frame 12.

The load port 11, the transfer frame 12, and the processing part are sequentially arranged in a line. Hereinbelow, a direction in which the load port 11, the transfer frame 12, and the processing part are arranged is defined as an X-axis direction. A direction perpendicular to the X-axis direction is defined as a Y-axis direction. A direction perpendicular to an X-Y plane including the X-axis direction and the Y-axis direction is defined as a Z-axis direction.

A carrier 13 accommodating a substrate is seated on the load port 11. A plurality of load ports 11 is provided. The plurality of load ports 11 is arranged in a line in the Y-axis direction. A front opening unified pod (FOUP) may be used as the carrier 13.

The processing part 20 includes a buffer module 21, a transfer chamber 22, a first process chamber 23, a second process chamber 24, and a controller (not shown) configured to control a substrate treatment process.

The processing part 20 may include a plurality of first process chambers 23 and a plurality of second process chambers 24. Substrates may be processed simultaneously or sequentially in the plurality of first process chambers 23 and the plurality of second process chambers 24.

The transfer chamber 22 is arranged such that a longitudinal direction thereof is parallel to the X-axis direction.

The buffer module 21 is disposed between the transfer frame 12 and the transfer chamber 22. The substrate transferred between the transfer chamber 22 and the transfer frame 12 waits in the buffer module 21.

The transfer frame 12 is transferred between the carrier 13 seated on the load port 11 and the buffer module 21. The transfer frame 12 includes an index rail 14 and an index robot 15.

The index robot 15 is provided on the index rail 14 and is rectilinearly moved in the Y-axis direction along the index rail 14. The index robot 15 is configured to transfer the substrate from the processing part 20 to the carrier 13 and to transfer the substrate from the carrier 13 to the processing part 20.

The first process chambers 23 and the second process chambers 24 may be configured to sequentially perform a process for a single substrate.

A liquid treatment process such as a cleaning process, a rinsing process, and a displacement process may be performed in the first process chamber 23. The displacement process may be performed an organic solvent. The organic solvent may be isopropyl alcohol (IPA).

A substrate cleaning unit 30 is provided in the first process chamber 23.

Figure 2:
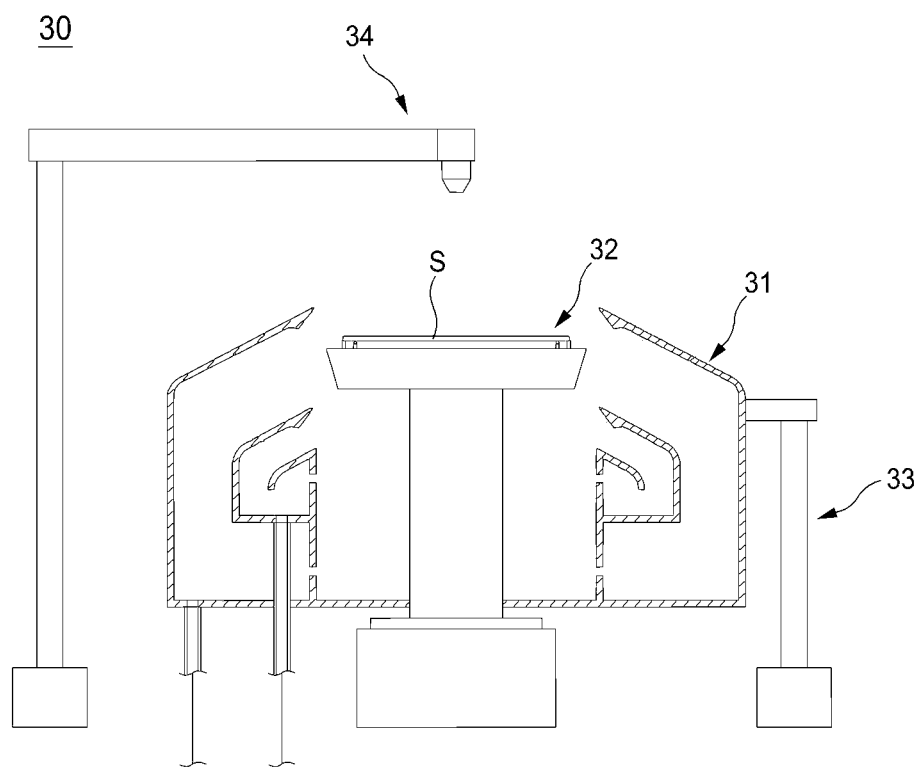
FIG. 2 is a view schematically showing a substrate cleaning unit of the substrate processing apparatus according to the embodiment of the present disclosure.

As shown in FIG. 2, the substrate cleaning unit 30 includes a recovery container 31, a spin head 32, a raising and lowering module 33, and a spray module 34.

The recovery container 31 provides a space in which the substrate S is cleaned. The recovery container 31 is configured to recover a chemical liquid supplied to the substrate S. While the substrate S is rotated by the spin head 32, when the chemical liquid is supplied to the substrate S, the chemical liquid is uniformly distributed on the substrate S and then is scattered from the substrate S. The scattered chemical liquid may be recovered to the recovery container 31.

The spin head 32 is re-arranged in the recovery container 31. The spin head 32 serves as support and rotate the substrate S.

The raising and lowering module 33 is configured to rectilinearly move the recovery container 31 in a vertical direction. As the recovery container 31 is moved in the vertical direction, the relative height of the recovery container 31 with respect to the spin head 32 will be adjusted.

The spray module 34 is configured to supply the processing liquid to the substrate S. A plurality of spray modules 34 may be provided. When the plurality of the spray modules 34 is provided, different processing liquids may be sprayed the spray modules 34.

The drying process of drying the substrate may be performed in the second process chamber 24. The drying process may be performed by using supercritical fluid. Carbon dioxide may be used as the supercritical fluid. Supercritical fluid serves to remove foreign substances between fine circuit patterns formed on the upper surface of the substrate.

The second process chamber 24 includes a substrate drying unit 40 therein. The substrate drying unit 40 performs the drying process for the substrate.

Figure 3:
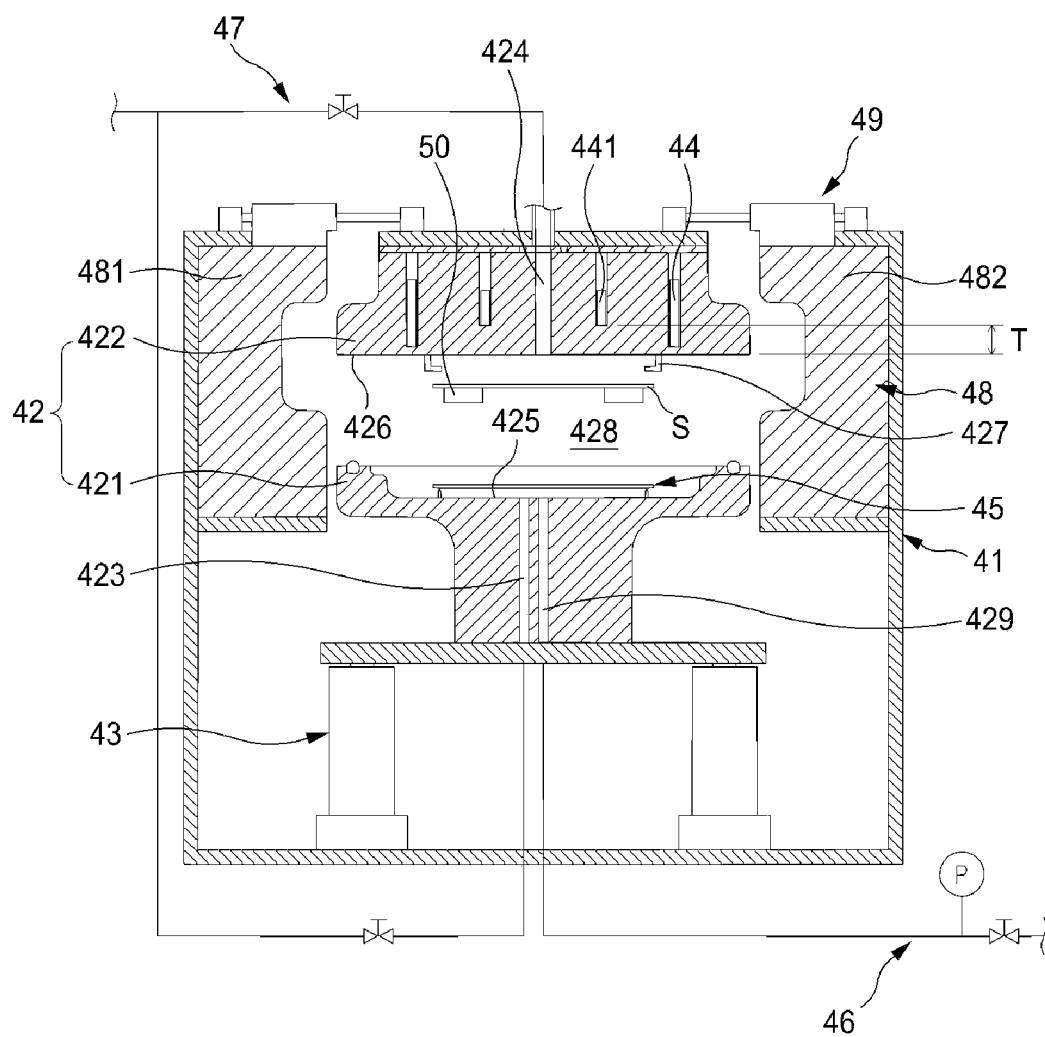
FIGS. 3 and 4 are views schematically showing a substrate drying unit of the substrate processing apparatus according to the embodiment of the present disclosure.
Figure 4:
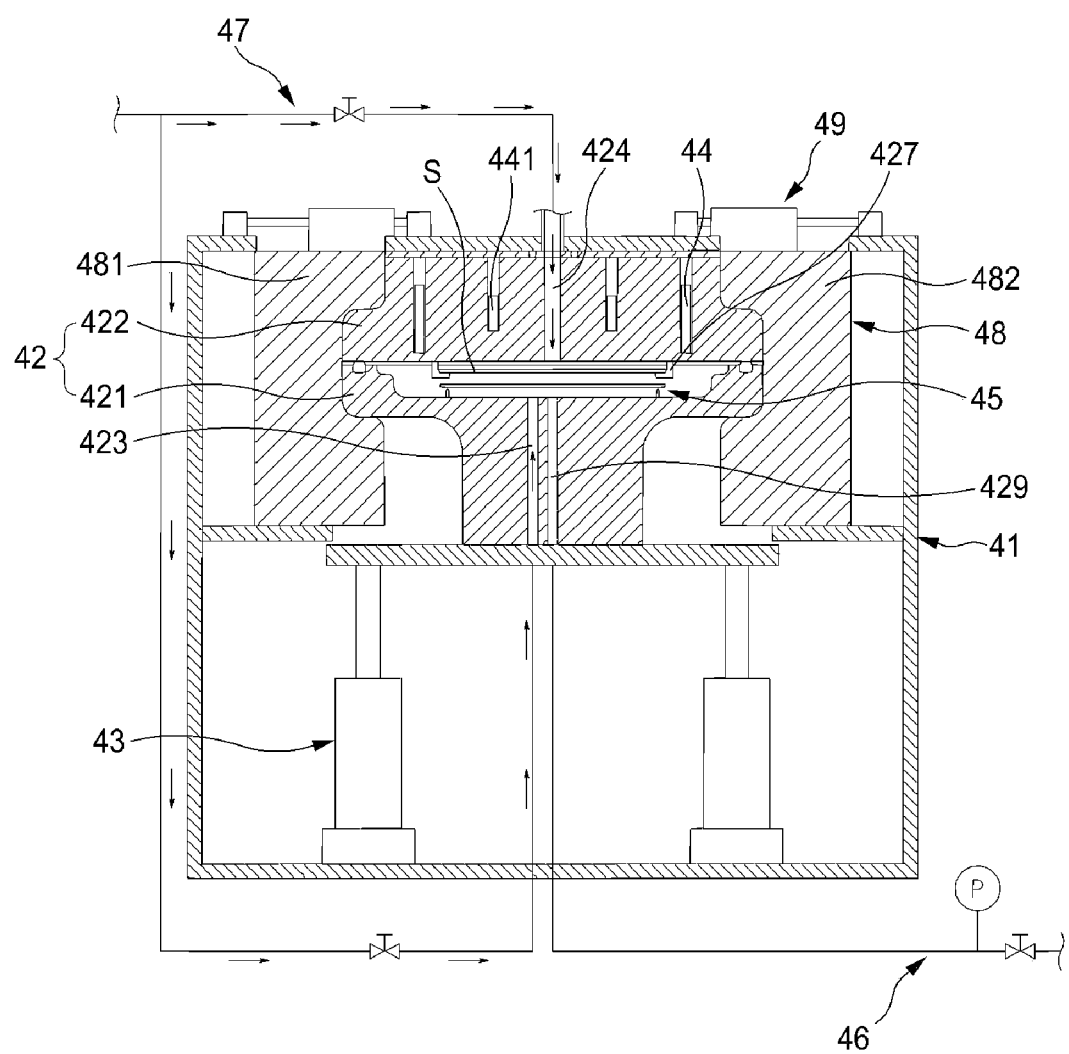

As shown in FIGS. 3 and 4, the substrate drying unit 40 is configured to dry the substrate S on which the organic solvent remains. The substrate drying unit 40 may dry the substrate S by using the supercritical fluid.

The substrate drying unit 40 includes a housing 41, a substrate processing container 42, a raising and lowering module 43, a heating module 44, a blocking module 45, an exhaust module 46, a fluid supply module 47, a clamping module 48, and a transfer module 49.

The substrate processing container 42, the raising and lowering module 43, the heating module 44, and the blocking module 45 are disposed in the housing 41.

A substrate processing space 428 accommodating the substrate S is provided inside the substrate processing container 42. The substrate processing container 42 includes a first body 421 and a second body 422.

The substrate processing space 428 may be sealed as the first body 421 and the second body 422 are coupled to each other.

The first body 421 includes a bottom surface (a first surface 425 facing the second body 422). The first surface 425 of the first body 421 is formed in a stepped shape. A center portion of the first surface 425 of the first body 421 is located lower than an edge thereof. For example, the first body 421 may generally be formed in a cylinder shape. The first body 421 may be raised or lowered with respect to the second body 422 by the raising and lowering module 43.

The first fluid supply flow path 423 and a first fluid discharge flow path 429 are formed inside the first body 421. The supercritical fluid may be supplied to the substrate processing space 428 through the first fluid supply flow path 423.

The second body 422 is coupled to the first body 421 to form the substrate processing space 428. The second body 422 is located at an upper portion of the first body 421.

The second body 422 includes an upper surface (a second surface 426 faces the first surface 425 of the first body 421). The second surface 426 of the second body 422 may be formed in a shape in which a center portion thereof is located higher than an edge thereof. For example, the second body 421 may generally be formed in a cylinder shape.

The second body 422 includes the second fluid supply flow path 424. The supercritical fluid may be supplied to the substrate processing space 428 through the second fluid supply flow path 424.

The second surface 426 of the second body 422 includes the substrate support parts 427. The substrate support parts 427 serve to support the substrate S in the substrate processing space 428. The substrate S has a processed surface (upper surface of the substrate S) and the unprocessed surface (lower surface of the substrate S). The substrate S is supported by the substrate support parts 427 so that the processed surface faces the second body 422 and the unprocessed surface faces the first body 421.

The raising and lowering module 43 adjusts a relative location between the first body 421 and the second body 422 by raising or lowering the first body 421. As the raising and lowering module 43 raises the first body 421, the first body 421 and the second body 422 may be located close to each other (referring to FIG. 4). As the raising and lowering module 43 lowers the first body 421, the first body 421 and the second body 422 may be spaced apart from each other (referring to FIG. 3).

The heating module 44 is configured to heat the substrate processing space 428. The heating module 44 heats the supercritical fluid supplied to the substrate processing space 428 above the critical temperature to maintain the supercritical fluid the supercritical state. The heating module 44 may consist of a heater. The heating module 44 may be provided inside the second body 422. For example, the heating module 44 may be loaded into a groove formed in the second body 422.

Figure 5:
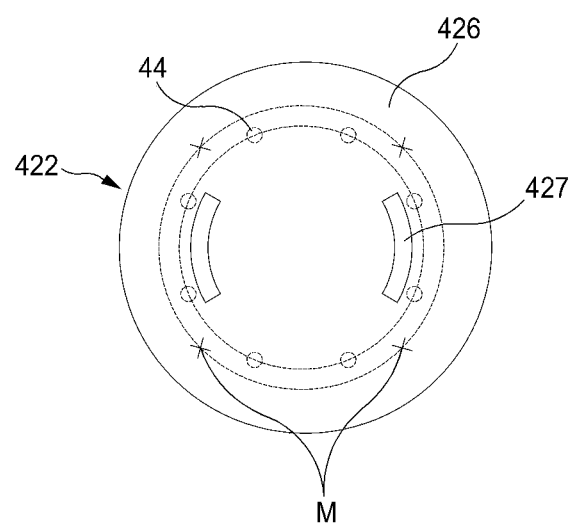
FIGS. 5 and 6 are views schematically showing a substrate processing container of the substrate drying unit of the substrate processing apparatus according to the embodiment of the present disclosure.
Figure 6:
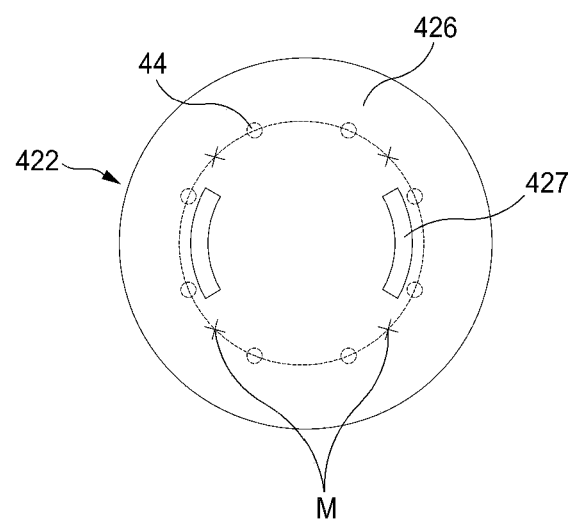

As shown in FIGS. 5 and 6, a plurality of heating modules 44 may be circumferentially arranged around the center of the second surface 426 of the second body 422. The plurality of heating modules 44 may be arranged on a single circle around the center of the second body 422. The plurality of heating modules 44 may be arranged at constant intervals. Therefore, the plurality of heating modules 44 may uniformly heat the substrate processing space 428.

A temperature sensor 441 may be provided inside the second body 422. For example, the temperature sensor 441 may be loaded into a groove formed in the second body 422.

The controller controls the heating modules 44 on the basis of the temperature measured by the temperature sensor 441 to control the temperature in the substrate processing space 428.

The blocking module 45 prevents the supercritical fluid supplied from the first fluid supply flow path 423 from being directly supplied into the unprocessed surface of the substrate S. For example, the blocking module 45 may include a blocking plate.

The exhaust module 46 is configured to discharge process by-products existing in the substrate processing space 428.

The fluid supply module 47 is configured to supply the supercritical fluid to the substrate processing space 428. The supercritical fluid is supplied in the supercritical state by supercritical temperature and supercritical pressure. The fluid supply module 47 may include a plurality of supply lines.

The clamping module 48 is configured to hold the first body 421 and the second body 422. As shown in FIG. 2, while the first body 421 and the second body 422 are brought into close contact with each other, the clamping module 48 may hold the first body 421 and the second body 422. The clamping module 48 includes a first clamping 481 and a second clamping 482. The first clamping 481 and the second clamping 482 are configured to be brought into close contact with the first body 421 and the second body 422.

The transfer module 49 may be configured to move the first clamping 481 and the second clamping 482. The first clamping 481 and the second clamping 482 may be moved close to each other by the transfer module 49 to hold the first body 421 and the second body 422 (referring to FIG. 4). The first clamping 481 and the second clamping 482 may be moved apart from each other by the transfer module 49 to release the first body 421 and the second body 422 (referring to FIG. 3).

In the transfer chamber 22, the substrate is transferred between the buffer module 21, the first process chamber 23, and the second process chamber 24.

As shown in FIG. 1, the transfer chamber 22 includes a guide rail 221 and a transfer robot 50.

The guide rail 221 is arranged such that a longitudinal direction thereof is in parallel to the X-axis direction. The transfer robot 50 is provided on the guide rail 221. The transfer robot 50 is rectilinearly moved in the X-axis direction along the guide rail 221.

As shown in FIG. 3, the transfer robot 50 serves to transfer the substrate S in the substrate processing space 428 of the substrate drying unit 40 and to load the substrate S on the substrate support parts 427. The transfer robot 50 serves to take the substrate S out of the substrate support parts 427 of the substrate drying unit 40.

Figure 7:
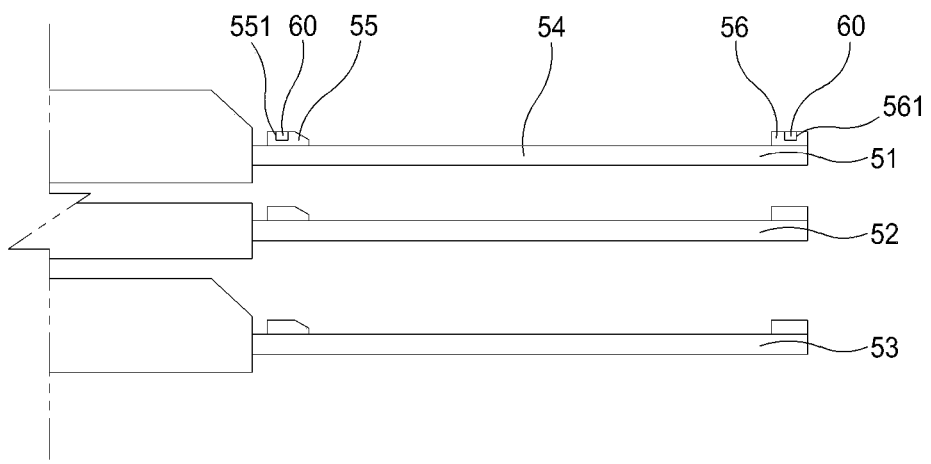
FIG. 7 is a view schematically showing a transfer robot of the substrate processing apparatus according to the embodiment of the present disclosure.

As shown in FIG. 7, the transfer robot 50 may include plurality of hands 51, 52, and 53.

The plurality of hands 51, 52, and 53 may include a first hand 51, a second hand 52, and a third hand 53.

The first hand 51, the second hand 52, and the third hand 53 may be vertically arranged in a line. The first hand 51 is arranged in the uppermost side, and the third hand 53 is arranged in the lowermost side. The second hand 52 is arranged between the first hand 51 and the third hand 53. The first hand 51, the second hand 52, and the third hand 53 may be moved individually.

Each of the first hand 51, the second hand 52, and the third hand 53 may have a substrate seating member 54, a first guide member 55, and a second guide member 56.

The substrate S is seated on the substrate seating member 54. The substrate seating member 54 may horizontally support the substrate S. The substrate seating member 54 may be formed in a plate shape.

The first guide member 55 and the second guide member 56 are projected from the substrate seating member 54. The first guide member 55 and the second guide member 56 may support a lateral surface of the substrate S. The first guide member 55 and the second guide member 56 prevent the substrate S from being separated from the substrate seating member 54.

The first hand 51 may be used to take the substrate S that has completed the process in the second process chamber 24 out of the second process chamber 24. The first hand 51 may be used to take the substrate S out of the substrate processing space 428 of the substrate drying unit 40.

The second hand 52 may be used to load the substrate S into the first process chamber 23. The second hand 52 may be used to load the substrate S on the spin head 32 of the substrate cleaning unit 30.

The third hand 53 may be used to load the substrate S that has completed the process in the first process chamber 23 into the second process chamber 24. The third hand 53 may be used to take the substrate S out of the spin head 32 of the substrate cleaning unit 30, and then to load the substrate S into the substrate support parts 427 of the substrate drying unit 40. The third hand 53 may be used to move the substrate S, on which the organic solvent is coated, from the substrate cleaning unit 30 to the substrate drying unit 40.

The first hand 51, the second hand 52, the third hand 53 may perform the process of loading the substrate S into the first process chamber 23, the process of taking the substrate S out of the first process chamber 23, the process of loading the substrate S into the second process chamber 24, and the process of taking the substrate S out of the second process chamber 24 simultaneously or sequentially. Therefore, the process of loading the substrate S into the first process chamber 23, the process of taking the substrate S out of the first process chamber 23, the process of loading the substrate S into the second process chamber 24, and the process of taking the substrate S out of the second process chamber 24 may be rapidly and efficiently performed.

The substrate processing apparatus of the present disclosure is not limited to the structure with the transfer robot having the three hands, and the substrate processing present disclosure may be applied to a structure with a transfer robot having a single hand, a structure with a transfer robot having two hands, and a structure with a transfer robot having four hands.

In a process in which the drying process for the substrate is performed in the substrate drying unit 40, surface temperatures of the first body 421 and the second body 422 increases. The temperature of the supercritical fluid supplied to the substrate processing space 428 is higher than a preset temperature of the substrate processing space 428, the surface temperature of the substrate processing container 42 (i.e., surface temperature of the first body 421 and surface temperature of the second body 422) increases.

When the surface temperature of the substrate processing container 42 increases, the supercritical fluid is unevenly distributed so that defect may occur in the substrate S.

The substrate drying unit 40 includes the temperature sensor 441. However, the temperature sensor 441 is provided in the second body 422 of the substrate processing container 42, so that a location difference T occurs between a location of the temperature sensor 441 and a location of the second surface 426 of the second body 422 (referring to FIG. 3). The location difference T prevents the temperature sensor 441 from properly measuring the surface temperature of the second surface 426.

Therefore, in order to prevent a defect of the substrate S caused due to the increasing of the surface temperature of the substrate processing container 42, the transfer robot 50 may have a surface temperature measurement sensor 60 (referring to FIG. 7).

The surface temperature measurement sensor 60 may be mounted to the first hand 51. The surface temperature measurement sensor 60 may be a non-contact temperature sensor. The non-contact temperature sensor may be an infrared sensor that measures infrared emissivity from an object. The surface temperature measurement sensor 60 may be a non-contact temperature sensor in which a focal distance is automatically adjusted.

A plurality of surface temperature measurement sensors 60 may be mounted to the first hand 51.

As an example, as shown in FIG. 5, the plurality of surface temperature measurement sensors 60 may be configured to measure the surface temperature of the second surface 426 of the second body 422 at a plurality of measuring points M that are arranged on a circle having the same center (concentricity) as the circle on which the plurality of heating modules 44 are arranged. Therefore, the plurality of surface temperature measurement sensors 60 may be a circle concentric with the circle on which the plurality of heating modules 44 is arranged.

As another example, as shown in FIG. 6, the plurality of surface temperature measurement sensors 60 may be configured to measure the surface temperature of the second surface 426 of the second body 422 at a plurality of measuring points M that are arranged on the circle on which the plurality of heating modules 44 are arranged. Therefore, the plurality of surface temperature measurement sensors 60 may be arranged on the circle on which the plurality of heating modules 44 are arranged.

As described above, the plurality of surface temperature measurement sensors 60 is configured to measure the surface temperature of the second surface 426 of the second body 422 at the measuring points M corresponding to the locations of the plurality of heating modules 44, so that the surface temperature of the second surface 426 of the second body 422 may be accurately measured.

In case in which the transfer robot 50 includes a single hand, the surface temperature measurement sensors 60 may be mounted to the single hand. In case in which the transfer robot 50 includes two or four hands, the surface temperature measurement sensors 60 may be mounted to a hand located the uppermost side.

The surface temperature measurement sensor 60 may measure not only the second surface 426 of the second body 422, but also the surface temperature of the first surface 425 of the first body 421. The surface temperature measurement sensor 60 may measure the surface temperature of the first surface 425 or the second surface 426 or both the surface temperatures of the first surface 425 and the second surface 426.

The surface temperature measurement sensor 60 may be connected to the controller. The controller may determine to load the substrate into the substrate processing container 42 on the basis of the surface temperature of the substrate processing container 42 measured by the surface temperature measurement sensor 60.

Furthermore, when the surface temperature of the substrate processing container 42 measured by the surface temperature measurement sensor 60 is less than the preset reference temperature range, the controller controls the heating modules 44 to heat the substrate processing space 428.

Furthermore, when the surface temperature of the substrate processing container 42 measured by the surface temperature measurement sensor 60 is higher than the preset reference temperature, the controller controls the heating modules 44 not to heat the substrate processing space 428.

The preset temperature range is a temperature range suitable for characteristics of the substrate S. The preset temperature range may be acquired by changing the surface temperature of the substrate processing container 42 while the substrate S is located in the substrate processing container 42, by measuring whether a defect of the substrate S occurs, and by measuring the temperature when a detect of the substrate S does not occur. The preset temperature range may be acquired by from the mean or deviation of a plurality of measured temperature values.

Accommodation grooves 551 and 561 are famed by being depressed, at predetermined depths, on the first guide member 55 and the second guide member 56 of the first hand 51. The surface temperature measurement sensors 60 may be mounted into the accommodation grooves 551 and 561. Therefore, when the first hand 51 transfers the substrate S, the surface temperature measurement sensors 60 are not in contact with the substrate S. Therefore, it is possible to prevent a damage occurring to the substrate S or the surface temperature measurement sensors 60 when the substrate S and the surface temperature measurement sensors 60 are in contact with each other.

Figure 8:
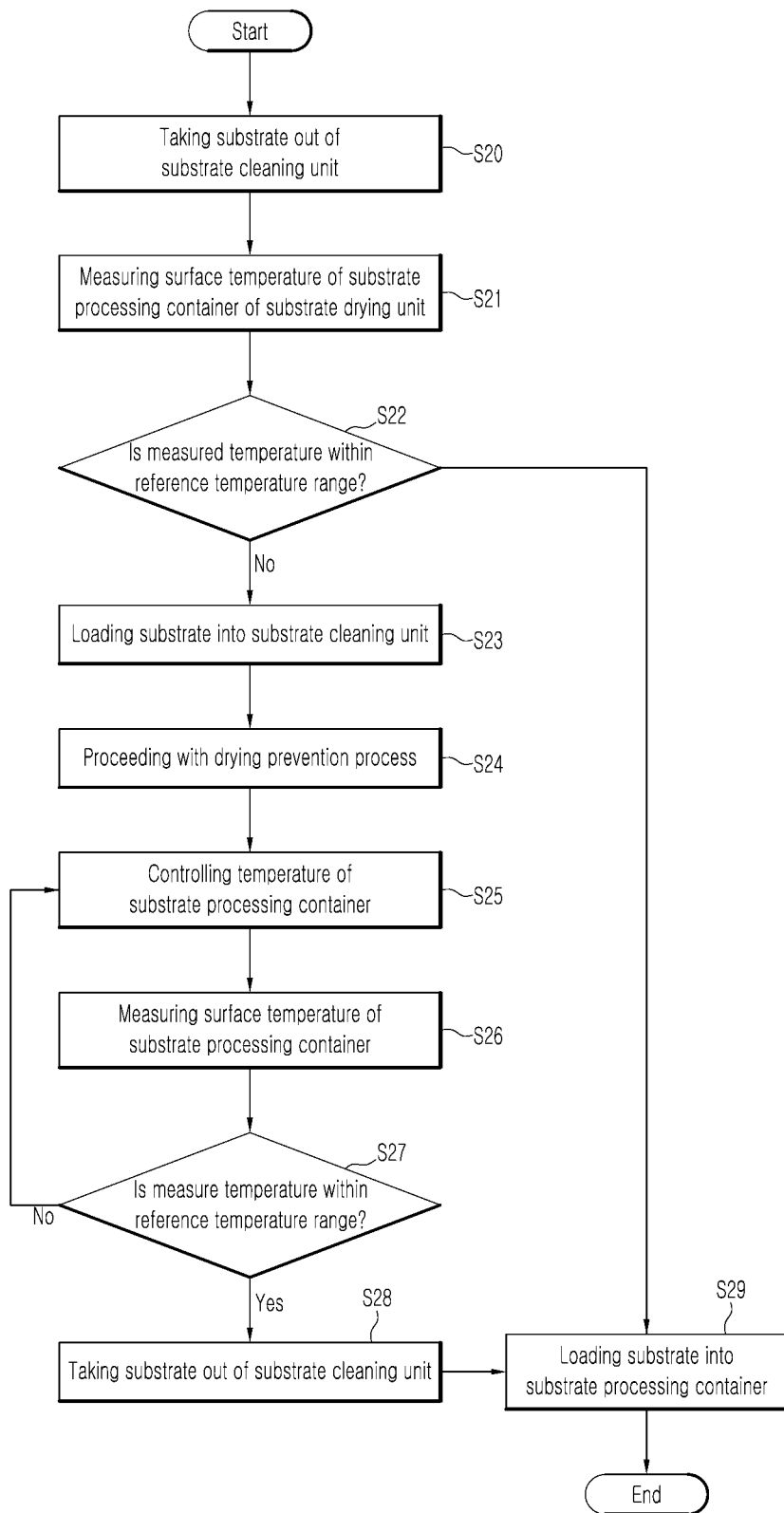
FIG. 8 is a flowchart schematically showing a substrate processing method according an embodiment of the present disclosure.

Hereinbelow, a substrate processing method according to an embodiment of the present disclosure will be described with reference to FIG. 8.

The third hand 53 of the transfer robot 50 takes a substrate S (following substrate S), which has been moved to the substrate cleaning unit 30 of the first process chamber 23 and been processed by the substrate cleaning unit 30, out of the substrate cleaning unit 30 at S10.

The controller detects whether a precedent substrate S exists in the substrate processing container 42 of the substrate drying unit 40 of the second process chamber 24 at S11.

When the precedent substrate S exists in the substrate processing container 42 of the substrate drying unit 40 at S12, the substrate S may not be loaded into the substrate processing container 42. Therefore, the first hand 51 of the transfer robot 50 takes the precedent substrate S out of the substrate processing container 42 at S13.

When the first hand 51 of the transfer robot 50 takes the precedent substrate S out, the surface temperature of the substrate processing container 42 may be measured by the surface temperature measurement sensors 60 formed on the first hand 51 at S13.

When the precedent substrate S does not exist in the substrate processing container 42 at S12, the first hand 51 of the transfer robot 50 is moved to the substrate drying unit 40 and measures the surface temperature of the substrate processing container 42 at S14.

The controller determines whether a measured value of the surface temperature of the substrate processing container 42 is within the reference temperature range at S16.

When the measured value of the surface temperature of the substrate processing container 42 is within the reference temperature range at S16, the third hand 53 of the transfer robot 50 loads the following substrate S into the substrate processing container 42 at S17. Therefore, the drying process for the substrate S may be performed in the substrate processing container 42 of the substrate drying unit 40.

When the measured value of the surface temperature of the substrate processing container 42 is not within the reference temperature range at S16, i.e., the surface temperature of the substrate processing container 42 is less than or higher than the preset temperature range, a process of controlling the inside temperature of the substrate processing container 42 may be performed at S15.

As an example, in the process of controlling the inside temperature of the substrate processing container 42, the first hand 51 may be continuously located in the substrate processing container 42. In some embodiments, in the process of controlling the inside temperature of the substrate processing container 42, the first hand 51 is moved out of the substrate processing container 42 and located outside the substrate processing container 42.

When the process of controlling the inside temperature of the substrate processing container 42 is completed, a process of measuring the surface temperature of the substrate processing container 42 by the surface temperature measurement sensors 60 provided in the first hand 51 may be performed again at S14.

When the surface temperature of the substrate processing container 42 is less than or higher than the preset temperature range, the process of controlling the inside temperature of the substrate processing container 42 may be performed again at S15.

When the surface temperature of the substrate processing container 42 is within the preset temperature range, the third hand 53 of the transfer robot 50 is moved into the substrate processing container 42 to load the substrate S into the substrate processing container 42.

Accordingly, the processing for the substrate S may be performed in the temperature range set suitable for the substrate S.

Hereinbelow, a substrate processing method according to an embodiment of the present disclosure will be described with reference to FIG. 9.

The third hand 53 of the transfer robot 50 is moved to the substrate cleaning unit 30 of the first process chamber 23 and takes the substrate S processed by the substrate cleaning unit 30 out of the substrate cleaning unit 30 at S20.

The first hand 51 of the transfer robot 50 is moved to the substrate drying unit 40 to measure the surface temperature of the substrate processing container 42 at S21.

The controller determines whether a measured value of the surface temperature of the substrate processing container 42 is within the reference temperature range at S22.

When the measured value of the surface temperature of the substrate processing container 42 is within the reference temperature range at S16, the third hand 53 of the transfer robot 50 loads the substrate S into the substrate processing container 42 at S29. Therefore, the drying process for the substrate S may be performed in the substrate processing container 42 of the substrate drying unit 40.

When a measured value of the surface temperature of the substrate processing container 42 is not within the reference temperature range at S22, i.e., the surface temperature of the substrate processing container 42 is less than or higher than the preset temperature range, the third hand 53 of the transfer robot 50 loads the substrate S into the substrate cleaning unit 30 at S23. The drying prevention process may be performed for the substrate S loaded into the substrate cleaning unit 30 at S24. A chemical liquid may be sprayed to the substrate S in the drying prevention process. Accordingly, it may prevent the surface of the substrate S from being dried.

As described above, when the measured value of the surface temperature of the substrate processing container 42 is not within the reference temperature range, the substrate S is not loaded into the substrate drying unit 40 and is loaded into the substrate cleaning unit 30, so that it may prevent the surface of the substrate S from being dried.

In the above process, the process of controlling the inside temperature of the substrate processing container 42 may be performed at S25.

As an example, in the process of controlling the inside temperature of the substrate processing container 42, the first hand 51 may be continuously located in the substrate processing container 42. In some embodiments, in the process of controlling the inside temperature of the substrate processing container 42, the first hand 51 is moved out of the substrate processing container 42 and located outside the substrate processing container 42.

When the process of controlling the inside temperature of the substrate processing container 42 is completed, the process of measuring the surface temperature of the substrate processing container 42 by the surface temperature measurement sensors 60 provided in the first hand 51 may be performed at S24.

When the surface temperature of the substrate processing container 42 is less than or higher than the preset temperature range, the process of controlling the inside temperature of the substrate processing container 42 may be performed again at S25.

When the surface temperature of the substrate processing container 42 is within the preset temperature range, the third hand 53 of the transfer robot 50 is moved into the substrate cleaning unit 30 during the drying prevention process and takes the substrate S out of the substrate cleaning unit 30 at S28.

The third hand 53 of the transfer robot 50 is moved into the substrate processing container 42 of the substrate drying unit 40 and loads the substrate S into the substrate processing container 42.

Accordingly, the processing for the substrate S may be performed in the temperature range set suitable for the substrate S.

Hereinbelow, a substrate processing method according to an embodiment of the present disclosure will be described with reference to FIG. 10.

The third hand 53 of the transfer robot 50 is moved to the substrate cleaning unit 30 of the first process chamber 23 and takes the substrate S that is processed by the substrate cleaning unit 30 out of the substrate cleaning unit 30 at S30.

The first hand 51 of the transfer robot 50 is moved into the substrate processing container 42 of the substrate drying unit 40 and the surface temperature measurement sensors 60 measure the surface temperatures of the plurality of substrate processing containers 42 at S31.

The controller determines whether the substrate drying unit 40 in which the measured temperature is within the reference temperature range exists at S32.

When the substrate drying unit 40 with the measured temperature within the reference temperature range exists, the third hand 53 of the transfer robot 50 is firstly moved into the substrate processing container 42 of the substrate drying unit 40 with the measured temperature within the reference temperature range to load the substrate S into the substrate processing container 42 at S33.

When the substrate drying unit 40 with the measured temperature within the reference temperature range does not exist, a process of controlling the inside temperature of the substrate processing container 42 of a plurality of substrate drying units 40 at S34.

When the process of controlling the inside temperature of the substrate processing container 42 is completed, the process of measuring the surface temperature of the plurality of substrate processing containers 42 by the surface temperature measurement sensors 60 provided in the first hand 51 may be performed at S24.

When the surface temperature of the substrate processing container 42 is less than or higher than the preset temperature range, the process of controlling the inside temperature of the substrate processing container 42 may be performed again.

When the surface temperature of the substrate processing container 42 is within the preset temperature range, the third hand 53 of the transfer robot 50 is moved into the substrate processing container 42 to load the substrate S into the substrate processing container 42.

Accordingly, the processing for the substrate S may be performed in the temperature range set suitable for the substrate S.

The substrate processing methods according to the embodiments of the present disclosure as described above may be combined with reference to FIGS. 8 to 10.

In the substrate processing apparatus and the substrate processing method according to the embodiments of the present disclosure, the surface temperature measurement sensors 60 configured to measure the surface temperature of the substrate processing container 42 are provided in the transfer robot 50. Therefore, the surface temperature measurement sensors 60 may accurately measure the surface temperature of the substrate processing container 42. Accordingly, it is possible to prevent the substrate S from being loaded into the substrate processing container 42 while the surface temperature of the substrate processing container 42 deviates from the preset temperature range. Therefore, while the surface temperature of the substrate processing container 42 deviates from the preset temperature range, ununiform distribution of the supercritical fluid caused as the substrate S is loaded into the substrate processing container 42 may be prevented. Therefore, a defect of the substrate S that may occur due to the ununiform distribution of the supercritical fluid may be prevented.

Although the embodiments of the present disclosure have been disclosed for illustrative purposes, those skilled in the art will appreciate that various modifications, additions and substitutions are possible, without departing from the scope and spirit of the invention as disclosed in the accompanying claims.

What is claimed is:

1. A substrate processing method of processing a substrate by using a substrate processing apparatus that comprises a substrate cleaning unit configured to clean the substrate and a substrate drying unit configured to dry the substrate and comprising a substrate processing container accommodating the substrate, the substrate processing method comprising:
  detecting whether a precedent substrate exists in the substrate processing container;
  measuring a surface temperature of the substrate processing container, wherein, when the precedent substrate exists in the substrate processing container, the measuring the surface temperature of the substrate processing container is performed during a time when the precedent substrate is taken out of the substrate processing container;
  determining whether the surface temperature of the substrate processing container deviates from a preset reference temperature range;
  transferring, in response to the determining that the surface temperature is within the preset reference temperature range, the substrate from the substrate cleaning unit to the substrate processing container of the substrate drying unit; and
  performing, in response to the determining that the surface temperature of the substrate processing container is out of the present reference temperature range, a drying prevention process on the substrate by spraying a chemical liquid to the substrate in the substrate cleaning unit.

2. The substrate processing method of claim 1, further comprising:
  controlling, in response to the determining that the surface temperature of the substrate processing container is out of the preset reference temperature range, the surface temperature of the substrate processing container.

3. The substrate processing method of claim 1,
  wherein the substrate processing apparatus comprises a plurality of substrate processing containers,
  wherein the measuring the surface temperature and the determining the surface temperature are performed for the plurality of substrate processing containers, and
  wherein the transferring the substrate is performed by loading the substrate into a substrate processing container, among the plurality of substrate processing containers, having a surface temperature within the preset reference temperature range.

4. The substrate processing method of claim 3, further comprising:
  controlling, in response to a surface temperature of a first substrate processing container, among the plurality of substrate processing containers, being out of the preset reference temperature range, the surface temperature of the first substrate processing container.

5. The substrate processing method of any one of claim 1,
  wherein the substrate processing apparatus comprises:
    a transfer robot comprising a first hand, a second hand, and a third hand,
    wherein the substrate processing method further comprises:
      taking the substrate out of the substrate drying unit by the first hand;
      loading the substrate into the substrate cleaning unit by the second hand; and
      taking the substrate out of the substrate cleaning unit and then loading the substrate into the substrate drying unit by the third hand, and
    wherein the measuring the surface temperature of the substrate processing container is performed by a surface temperature measurement sensor provided in the first hand.

6. A substrate processing method of processing a substrate by using a substrate processing apparatus that comprises a substrate cleaning unit configured to clean the substrate, and a substrate drying unit configured to dry the substrate and comprising a substrate processing container accommodating the substrate, the substrate processing method comprising:
  taking the substrate out of the substrate cleaning unit;
  measuring surface temperature of the substrate processing container;
  determining whether the surface temperature of the substrate processing container deviates from a preset reference temperature range;
  transferring, in response to the determining that the surface temperature of the substrate processing container is within the preset reference temperature range, the substrate to the substrate drying unit; and
  in response to the determining that the surface temperature of the substrate processing container is out of the preset reference temperature range, loading back the substrate into the substrate cleaning unit and performing a drying prevention process on the substrate by spraying a chemical liquid to the substrate.

7. The substrate processing method of claim 6, further comprising:
  controlling, in response to the determining that the surface temperature of the substrate processing container is out of the preset reference temperature range, the surface temperature of the substrate processing container.

8. The substrate processing method of claim 6, further comprising:
  before the measuring the surface temperature of the substrate processing container, detecting whether a precedent substrate exists in the substrate processing container,
  wherein, when the precedent substrate exists in the substrate processing container, the measuring the surface temperature of the substrate processing container is performed after taking the precedent substrate out of the substrate processing container.

9. The substrate processing method of claim 6, further comprising:
  supplying a chemical liquid to the substrate loaded into the substrate cleaning unit in the loading the substrate so as to prevent a surface of the substrate from drying.

10. The substrate processing method of claim 6,
  wherein the substrate processing apparatus comprises a plurality of substrate processing containers,
  wherein the measuring the surface temperature and the determining the surface temperature are performed for the plurality of substrate processing containers, and
  wherein the transferring the substrate is performed by loading the substrate into a substrate processing container, among the plurality of substrate processing containers, having a surface temperature within the preset reference temperature range.

11. The substrate processing method of claim 10, further comprising:
  controlling, in response to a surface temperature of a first substrate processing container, among the plurality of substrate processing containers, being out of the preset reference temperature range, the surface temperature of the first substrate processing container.

12. The substrate processing method of any one of claim 6,
  wherein the substrate processing apparatus comprises a transfer robot comprising a first hand, a second hand, and a third hand, wherein the substrate processing method further comprises:

taking the substrate out of the substrate drying unit by the first hand;

loading the substrate into the substrate cleaning unit by the second hand; and taking the substrate out of the substrate cleaning unit and then loading the substrate into the substrate drying unit by the third hand, and wherein the measuring the surface temperature of the substrate processing container is performed by a surface temperature measurement sensor provided in the first hand.

\* \* \* \* \*